United States Patent [19]

Akashi

[11] Patent Number: 5,067,762

[45] Date of Patent: Nov. 26, 1991

[54] NON-CONTACT CONVEYING DEVICE

[76] Inventor: Hiroshi Akashi, 7-12, Kitasakurazuka 2-chome, Osaka-fu, Toyonaka, Japan

[21] Appl. No.: 343,344

[22] Filed: Apr. 26, 1989

Related U.S. Application Data

[63] Continuation-in-part of Ser. No. 103,361, Oct. 1, 1987, abandoned, which is a continuation-in-part of Ser. No. 3,254, Jan. 14, 1987, abandoned, which is a continuation of Ser. No. 875,712, Jun. 18, 1986, abandoned.

[30] Foreign Application Priority Data

| Jun. 18, 1985 | [JP] | Japan | 60-132650 |
| Jul. 27, 1985 | [JP] | Japan | 60-166145 |
| Aug. 14, 1985 | [JP] | Japan | 60-178777 |
| Sep. 7, 1985 | [JP] | Japan | 60-198730 |
| Sep. 19, 1985 | [JP] | Japan | 60-208284 |
| Dec. 30, 1985 | [JP] | Japan | 60-297489 |
| Feb. 17, 1986 | [JP] | Japan | 61-34048 |
| Apr. 21, 1986 | [JP] | Japan | 61-91652 |
| May 12, 1986 | [JP] | Japan | 61-108197 |

[51] Int. Cl.$^5$ ............................................. B25J 15/06
[52] U.S. Cl. ........................... 294/64.3; 271/97; 901/40
[58] Field of Search ................ 294/64.1–64.3; 269/21; 271/90, 97, 98, 195; 406/88, 152, 153; 414/225, 737, 744 B, 752; 901/40

[56] References Cited

U.S. PATENT DOCUMENTS

| 3,223,443 | 12/1965 | Misson | 294/64.3 X |
| 3,438,668 | 4/1969 | Olsson et al. | 294/64.3 |
| 3,466,079 | 9/1969 | Mammel | 294/64.3 |
| 3,523,706 | 8/1970 | Logue | 294/64.3 |
| 3,539,216 | 11/1970 | Forcier | 294/64.3 |
| 3,993,301 | 11/1976 | Vits | 294/64.3 X |
| 4,002,254 | 1/1977 | Olofsen | 294/64.3 X |
| 4,009,785 | 3/1977 | Trayes | 294/64.3 X |
| 4,029,351 | 6/1977 | Apgar et al. | 294/64.3 |
| 4,474,397 | 10/1984 | Hassan et al. | 294/64.3 |
| 4,566,726 | 1/1986 | Correnti et al. | 294/64.3 |

FOREIGN PATENT DOCUMENTS

| 2524916 | 12/1976 | Fed. Rep. of Germany | 294/64.3 |
| 257628 | 11/1969 | U.S.S.R. | 294/64.3 |
| 0732198 | 5/1980 | U.S.S.R. | 294/64.3 |
| 1024275 | 6/1983 | U.S.S.R. | 294/64.3 |
| 1151497 | 4/1985 | U.S.S.R. | 294/64.3 |
| 748138 | 4/1956 | United Kingdom | 294/64.3 |
| 944175 | 12/1963 | United Kingdom | 294/64.3 |
| 1054966 | 1/1967 | United Kingdom | 294/64.3 |

OTHER PUBLICATIONS

IBM Technical Disclosure Bulletin, vol. 19, No. 4, Sep. 1976, "Beveled Bernoulli Head" by Cunningham et al.
IBM Technical Disclosure Bulletin, vol. 11, No. 2, Jul. 1968, "Wafer Pickup With Air Barrier" by Hayunga.
IBM Technical Disclosure Bulletin, vol. 19, No. 12, May 1977, "Handling Apparatus for Flexible Magnetic Disks" by Parker et al.
IBM Technical Disclosure Bulletin, vol. 22, No. 8A, Jan. 1980, "Self-Centering Non-Contact Pick-Up" by Coles.

*Primary Examiner*—Johnny D. Cherry

[57] ABSTRACT

A non-contact conveying device for lifting and/or supporting wafer-like articles without physical contact with the articles. The device has a pickup head with a cushion-vacuum room fully opened at its bottom and has an ejector opening located at the center of its upper wall and communicating with the cushion-vacuum room of the pickup head. The ejector opening is coupled to a positive pressure gas supply. The pickup head has an operating surface at the bottom of the side wall which is positioned adjacnet to an article to be lifted. In the case of a wide clearance existing between the operating surface and the article, the non-contact conveying device works as an ejector and the pressure within the cushion-vacuum room is decreased since the cushion-vacuum room acts in the manner of a vacuum room of an ejector and the space formed between the operating surface and the article acts in the manner of a diffuser of an ejector. In the case of a small clearance existing between the cushion-vacuum room and the article, the non-contact conveying device operates like a hovercraft and the pressure with the cushion-vacuum room increases, since the cushion-vacuum room acts in manner of a pressure room of a hovercraft.

8 Claims, 15 Drawing Sheets

FIG.17
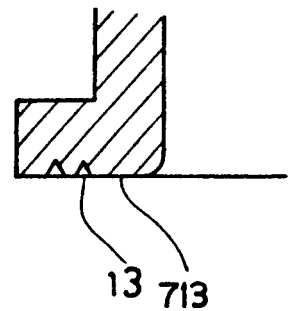
13 713
FIG.18
FIG.19
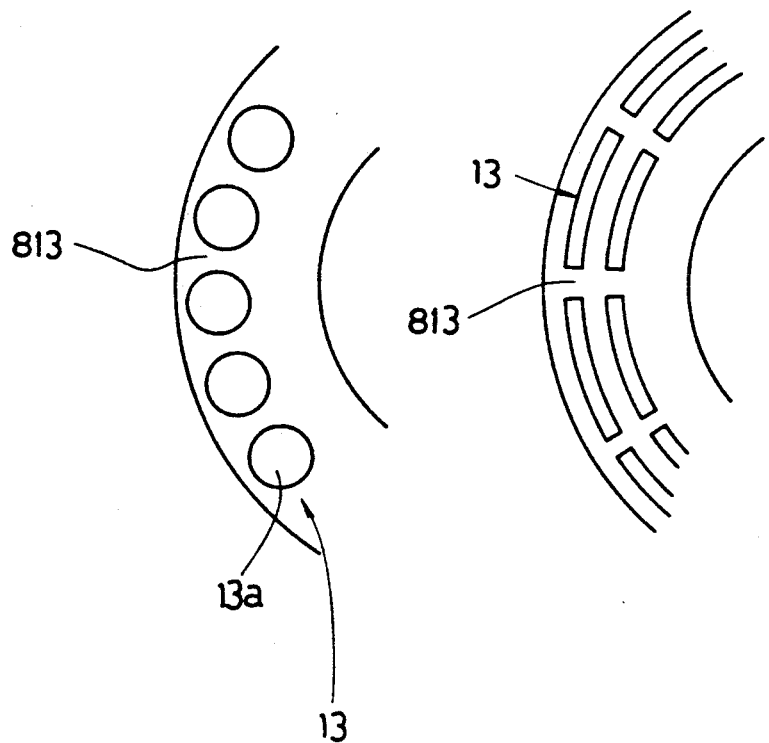

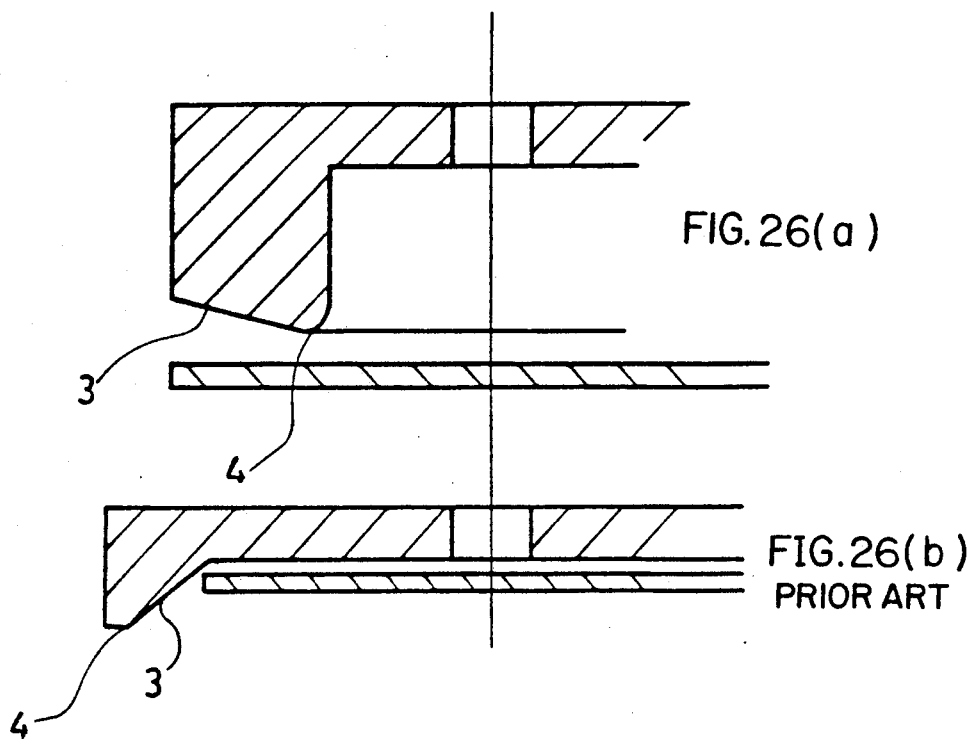
FIG. 26(a)
FIG. 26(b) PRIOR ART
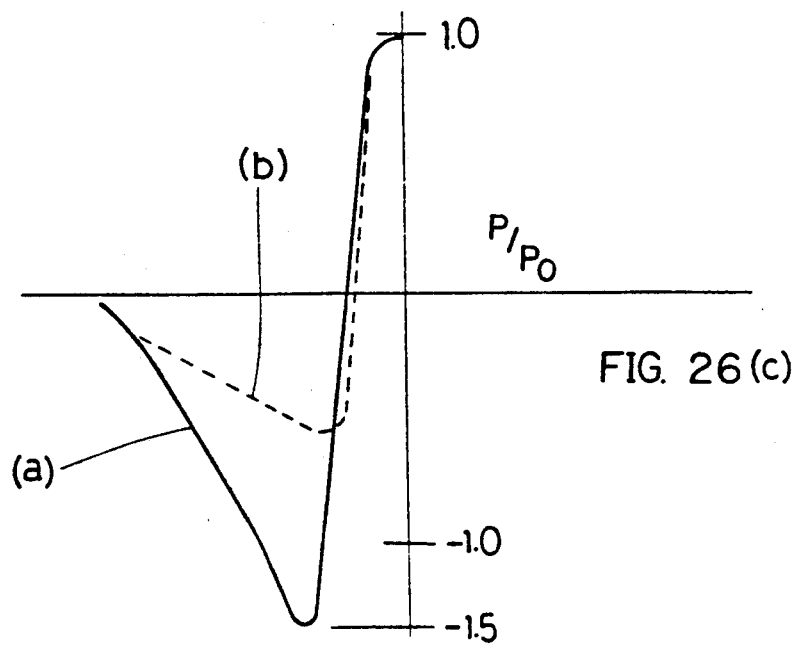
FIG. 26(c)

NON-CONTACT CONVEYING DEVICE

This application is a continuation-in-part of application Ser. No. 07/103,361 filed on Oct. 1, 1987, now abandoned, which is a continuation-in-part of application Ser. No. 07/003,254 filed on Jan. 14, 1987, now abandoned, which is a continuation of application Ser. NO. 06/875,712 filed on June 18, 1986, now abandoned.

BACKGROUND OF THE INVENTION

1. Field of the invention

The present invention relates to a non-contact conveying device for lifting up articles without physical contact with the articles by utilizing a gaseous medium such as air. Specifically, this invention relates to a device utilizing ejector effect and Bernoulli effect to lift up articles, as well as hovercraft effect and gas flow cushion effect to prevent injurious contact to the surface of the device.

2. Description of the Prior Art

The use of a gaseous medium such as air to support and/or lift articles is well known in the art and includes, for example, such devices as pickup heads and air truck systems.

In certain devices, suction, such as a vacuum or a negative pressure source, is employed to lift and/or support the articles. However, in many applications, for example processing and handling of semiconductor wafers, the use of a vacuum device is undesirable because physical contact between articles and a pickup device makes the articles susceptible to contamination and/or damage.

Other devices which use a positive pressure source to lift or support an article are of the so-called Bernoulli type.

Examples of Bernoulli type pickup head are disclosed in U.S. Pat. Nos. 3,438,668; 3,539,216; 4,002,254; 4,009,785; 4,029,351; 4,566,726; 3,523,706; 3,993,301; and a publication entitled "Wafer pickup with air barrier" (IBM Technical Disclosure Bulletin, Vol. 11, No. 2, July 1968).

All of these aforementioned devices are contructed to utilize the pressure-velocity relationship expressed in the Bernoulli principle to achieve a desired Pickup action.

The devices are constructed with a gas-flow boundary surface arranged adjacent the article that is to be picked up, such as a semiconductor wafer. A nozzle coupled to a positive pressure gas supply is formed in the middle of the flow boundary surface.

The velocity of the air flow is increased as it leaves the nozzle and consequently the pressure adjacent the flow boundary surface will be decreased. So, therefore, if the flow boundary surface is placed near a complimentary surface of an article to be picked up, the pressure between them will be sufficient to cause the article to be moved toward the flow boundary surface and thereby be picked up. At the same time, the flowing air provides a cushion to prevent damaging contact of the article with the surface of the device.

The aforementioned patents and publications disclose devices that utilize the Bernoulli effect to pickup articles and the gas flow cushion effect.

However, the non-contact conveying device of this invention utilizes not only ejector effects and Bernoulli effects to pick up articles, but also hovercraft effects and gas flow cushion effects to prevent the damaging contact.

U.S. Pat. No. 3,233,433 and a publication entitled "Self-Centering Non-Contact Pick-up", (IBM Technical Disclosure Bulletin, Vol. 2, Jan. 1980) have a chamber connected to a vacuum supply to lift articles as well as a chamber connected to a pressure supply to prevent contact with articles. However, in the pickup head of the present invention, the motion to lift up articles is achieved only by the gaseous flow of positive pressure.

U.S. Pat. No. 4,474,397 utilizes a suction force by an aspirator jet caused by exhaust gas. But, it has none of the Bernoulli effect, hovercraft and gas flow cushion effect.

A pickup head of the IBM Technical Disclosure Bulletin of September, 1976 (Vol. 19, No. 4) has a downwardly opening chamber having a downwardly inclined inner surface wherein the article exists at the bottom thereof, and a vertically extending inlet nozzle as shown in FIG. 26(b). FIG. 26(a) shows the pickup head of the present invention. FIG. 26(c) shows a graph of the relationship between the pressure caused on the surface of an article and the distance from the center of the pickup head, wherein P is the pressure caused on the surface of an article and Po is the pressure of the positive gas supply. It can be seen that the maximum negative pressure ratio P/Po of the present invention is about $-1.5$. The maximum negative pressure P/Po of the pick up head of the IBM device is $-0.6$ and is substantially smaller than that of the invention. The ratio P/Po of the IBM device is similiar to that of the prior pickup head of the Bernoulli type utilizing only the Bernoulli effect and gas flow cushion shown in FIG. 5. It is recognized that, in the IBM pickup head having a downwardly inclined inner slope, the only way of lifting the article is by means of the Bernoulli effect which is caused by the reduced static pressure produced by gaseous flow in the narrow space formed between the pickup head and the upper surface of the article, the same as the ordinary prior art shown in FIG. 5. Thus, the narrow space formed between the article and the pickup head of the IBM device does not work as a cushion-vacuum room.

In order to enable the opening chamber to function as a cushion-vacuum room, a diameter of the article should be larger than that of the Bernoulli Part which is the lowest part of the operating surface. However, in the pickup head of IBM, the outer surface of the article is positioned near the inclined inner slope of the pickup head, that is, the opening chamber of IBM pickup head is not the cushion-vacuum room. Furthermore, to keep the diameter of the article larger than that of the Bernoulli part, the gas flow will flow smoothly in the clearance between the article and the Bernoulli part, and accordingly, Bernoulli effect is effective, and the ejector effect in the cushion-vacuum room becomes larger because of the effective Bernoulli effect.

The pickup heads of British Patent No. 1,054,966 produce only a Bernoulli action which is caused by a reduced static Pressure by conducting a current of gas through a gap between the device and a surface of the article. A deflecting element is disposed to attain the highest possible jet velocity in the passage to decrease the resistance of flow from the conduit into the passage Russian Patent No. 1,151,497 lifts an article by a reduced static pressure due to Bernoulli effect.

As described above, the aforementioned patents and publications utilize only Bernoulli effect to lift articles and gas flow cushion to prevent injurious contact of articles with the surface of the device.

The non-contact conveying device of this invention utilizes not only ejector effect and Bernoulli effect to lift articles, but also hovercraft effect and gas flow cushion effect to prevent injurious contact of articles with the surface of the device.

SUMMARY OF THE INVENTION

According to one aspect of the present invention, there is provided a non-contact conveying device having two kinds of functions. One function is to lift up articles due to ejector effect and Bernoulli effect and the other function is to prevent contact between the non-contact conveying device and articles due to both hovercraft effect and gas flow cushion effect.

The non-contact conveying device of the present invention has a pickup head which has an upper wall and a side wall surrounding the upper wall. The upper wall and the side wall form a cushion-vacuum room which is fully opened at the bottom of the pickup head. The pickup head has an ejector opening which is disposed approximately at the center of the upper wall of the pickup head communicating with the cushion-vacuum room. The ejector opening is adapted to be connected to a positive pressure gas supply and the diameter of the ejector opening is smaller than that of the cushion-vacuum room. An operating surface adjacent to an article to be lifted is formed at the bottom of the side wall of the Pickup head and the operating surface has a Bernoulli surface defined as the lowest part of the operating surface. The diameter of the Bernoulli surface is smaller than that of the article to be lifted.

The gas flow enters through the ejector opening into the cushion-vacuum room and discharges outside passing through a space formed between the operating surface and the article. In case a wide clearance exists between the operating surface of the pickup head and the article, the non-contact conveying device operates as an ejector. The pressure within the cushion-vacuum room of the pickup head is decreased by ejector effect and the pressure at the space existing between the Bernoulli surface of the pickup head and the article is decreased due to Bernoulli effect of the increased velocity of the gas flow Passing through the narrow space between them, whereby the article is picked up by the pickup head.

When a small clearance is formed between the Bernoulli surface and the article, the Bernoulli part has the function of a gas flow cushion effect and the cushion-vacuum room of the pickup head operates as a pressure room of a hovercraft. The pressure within the cushion-vacuum room due to the pressure rise balances with the suction effect.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in this detailed description.

An object of the present invention is to provide a non-contact conveying device to lift and/or support articles.

Another object of the present invention is to Provide a non-contact conveying device that has a Plurality of individual cushion-vacuum rooms.

Still another object of the present invention is to provide a non-contact conveying device that has a guide means to prevent lateral movement of articles.

A further object of the present invention is to Provide a non-contact conveying device having a hood equipped with a suction pipe.

A further object of the present invention is to Provide a non-contact conveying system that has a moving means and a non-contact conveying device attached at said moving means.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 17 shows a further embodiment of the present invention, in a partial sectional side view;

FIGS. 18 and 19 are each a bottom plan view of further embodiments of the present invention;

FIG. 25(a) is an explanatory diagram of the present invention, FIG. 26(b) a prior art device, and FIG. 26(c) shows a relationship between the pressure caused on the surface of an article and the distance form the center of the pickup head.

DETAILED DESCRIPTION OF PREFERRED EMBODIMENTS

Figure 1:
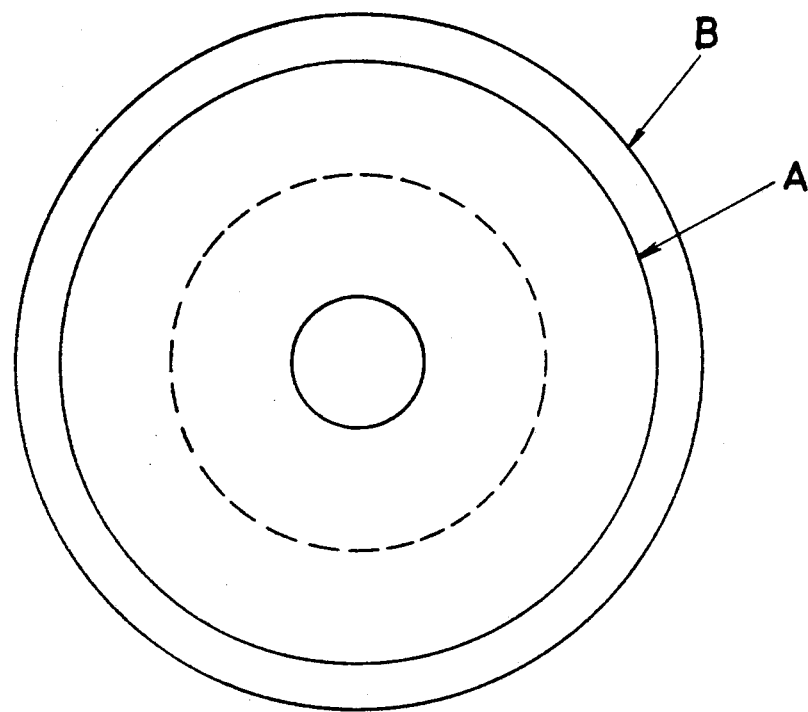
FIG. 1 is a top plan view of a preferred embodiment of the present invention.
Figure 2:
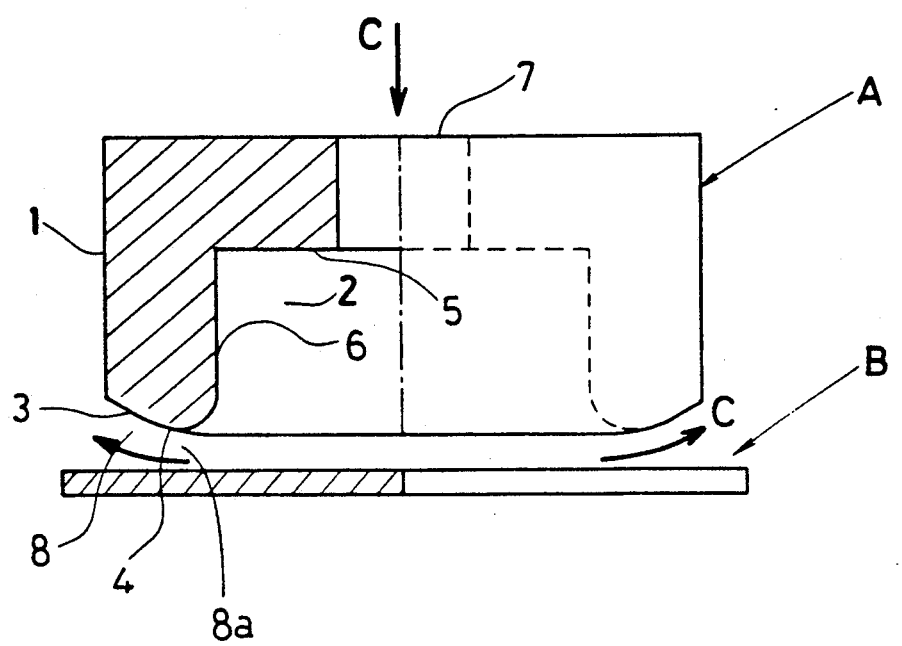
FIG. 2 is a partial sectional side view of the Preferred embodiment shown in FIG. 1.
Figure 20:
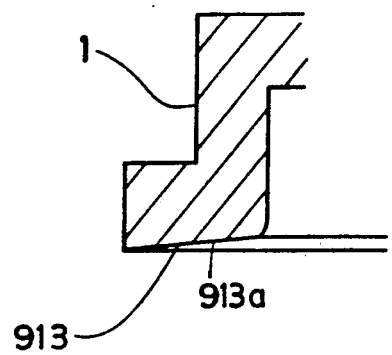
FIGS. 20, 21, 22, and 23 are partial sectional views of still further embodiment of the present invention.
Figure 21:
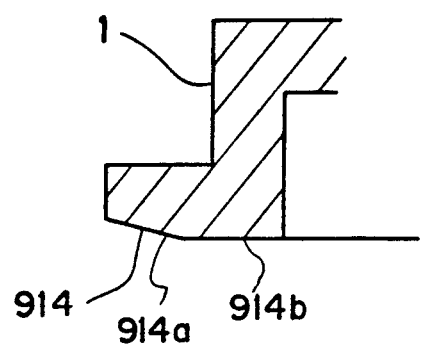
Figure 22:
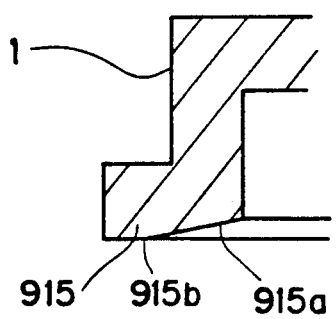

Like parts are shown by like reference numerals throughout the embodiments. Referring to FIGS. 1 and 2, there is shown the non-contact device of the present invention. The non-contact conveying device A has a pickup head 1 which has an upper wall 5 and a side wall 6 surrounding the upper wall 5, the upper wall 5 and the side wall 6 forming a cushion-vacuum room 2 therein fully opened at the bottom of the pickup head 1. An ejector opening 7 is disposed approximately at the center of the upper wall 5 communicating with the cushion-vacuum room 2. The ejector opening 7 is adapted to be connected to a positive pressure gas supply (not shown) and the diameter of it is smaller than that of the cushion-vacuum room 2. An operating surface 3 having a Bernoulli surface 4 is formed at the bottom of the side wall 6 of the pickup head 1. The operating surface 3 is adjacent to an article to be lifted. The Bernoulli surface 4 is defined as the lowest part of the operating surface 3 surrounding the cushion-vacuum room 2. In case the pickup head has a flat planar operating surface as shown in FIGS. 14, 15, 17, 23, and 24, the Bernoulli surface is defined as the most inner part near the cushion-vacuum room 2. The ejector opening 7 extends vertically towards the flat operating surface 3 in which the Bernoulli surface 4 exists and the diameter of the Bernoulli surface 4 is smaller than that of the article B. The operating surface 3 is round shaped in the vertical section including the axis of the ejector opening 7 in the embodiment shown in FIG. 2. However, the operating surface may be formed in other various shapes, such as flat or conical shaped as shown in FIGS. 14, 15, 17, 23, and 24 conical shaped as shown in FIGS. 20, 21, and 22 and curved shaped shown in FIGS. 2, 7, 9, and 10.

A gas flow indicated by arrow C into the cushion-vacuum room 2 from the ejector opening 7 passes through a space 8 formed between the operating surface 3 and the article B and discharges outside. In the case of a wide clearance between the operating surface 3 and the article B, the non-contact conveying device A utilizes two types of suction effects to pick up and/or support the article B. One is an ejector effect and the other is a Bernoulli effect.

Figure 3:
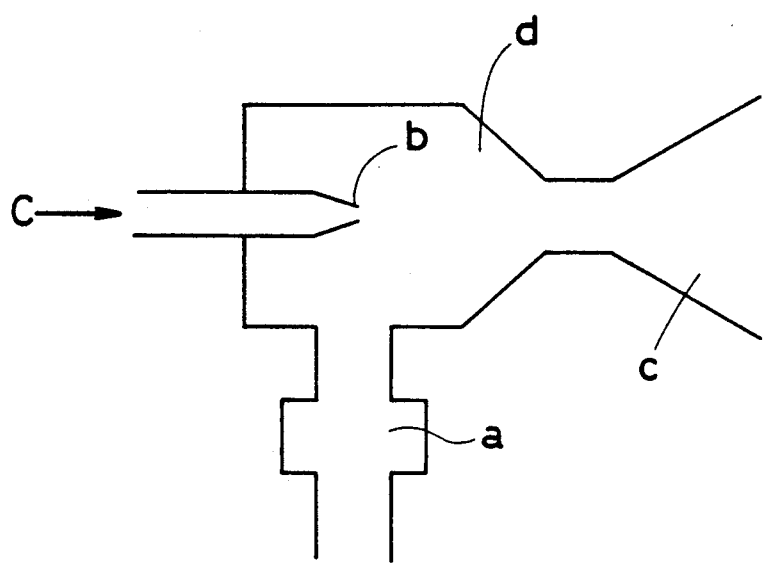
FIG. 3 is an explanatory diagram of an ejector.

In FIG. 3, an explanatory diagram of the function is shown. In the case that a clearance between the pickup head 1 and the article B is wide, the cushion-vacuum room 2 of the pickup head 1 operates as a vacuum room a of an ejector, the ejector opening 7 of the non-contact conveying device A operates as a nozzle b of the ejector, and the space 8 between the operating surface 3 and the article B operates as a diffuser c of the ejector.

In FIG. 3, the gas flow indicated by arrow C is jetted from nozzle b into a mixing room d and thereafter passes through the diffuser and discharges outside. During the flow of the gas, a suction power is applied to vacuum room and the pressure of the vacuum room a is decreased.

In FIGS. 1 and 2, the gas flow indicated by arrow C into the cushion-vacuum room 2 from the ejector opening 7 thereafter passes through the space 8 existing between the operating surface 3 and the article B at a high velocity and discharges outside resulting in the pressure of the cushion-vacuum room 2 being decreased by the ejector effect. Also, the velocity of the gas flow passing through the narrowest space $8a$ existing between the Bernoulli surface 4 of the operating surface 3 and the article B is increased and thereby the pressure of the space $8a$ is decreased by the Bernoulli effect. For this reason, the diameter of the Bernoulli surface 4 which surrounds the cushion-vacuum room 2 should be smaller than that of the article B. The article B is picked up by decreased pressure both in the cushion-vacuum room 2 and at the space $8a$ owing to the ejector effect and Bernoulli effect. The pressure decrease by the gas flow indicated by arrow C is much larger in the cushion-vacuum room 2 than at the space $8a$ as shown by the pressure curve of the parameter $h/d=0.02$ of the graph shown in FIG. 4. The pressure decrease is also much larger than that of the prior art having no cushion-vacuum room as shown in FIGS. 5 and 26.

Figure 4:
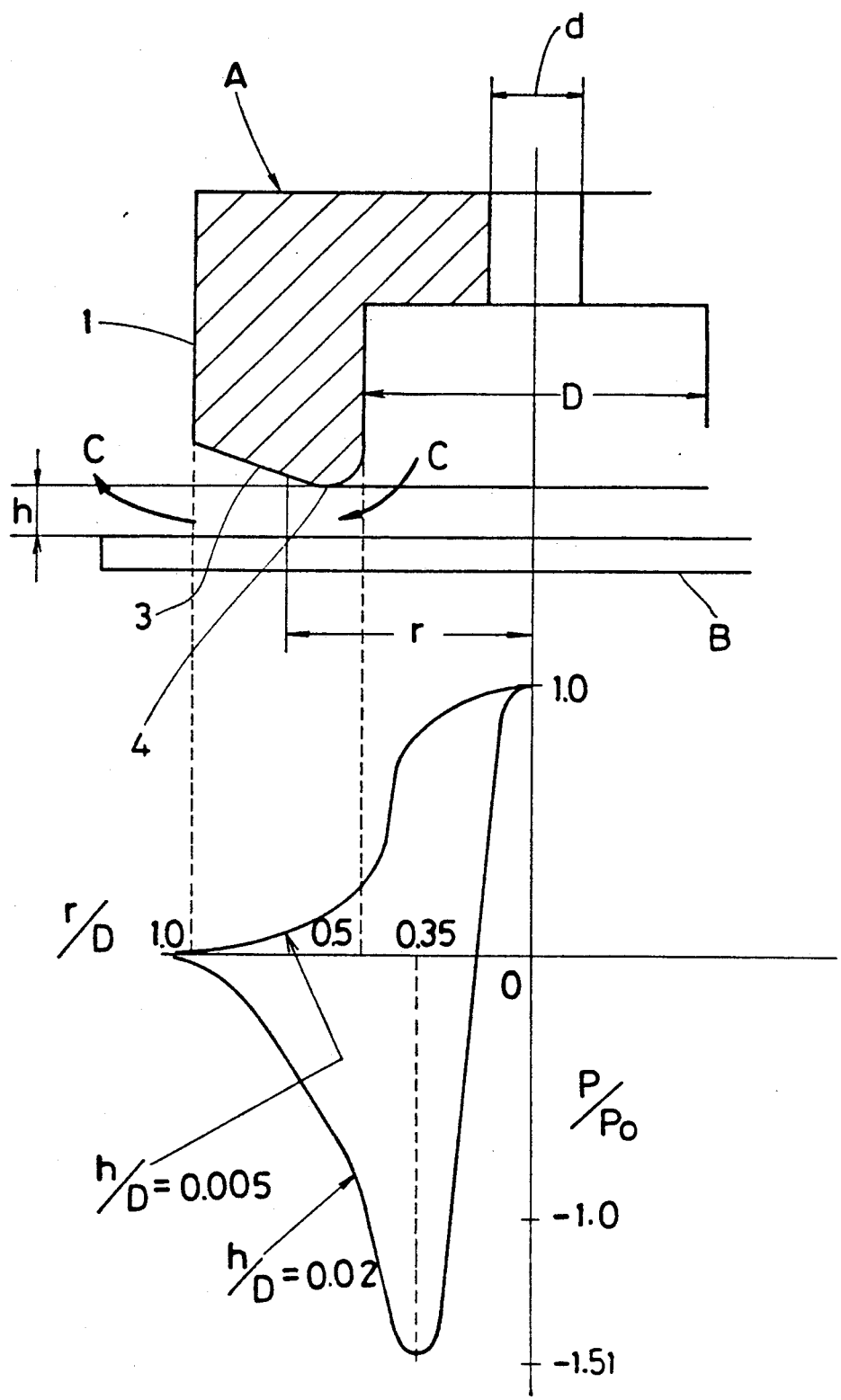
FIG. 4 shows a graph of the relationship of the pressure to the distance from the center of the non-contact conveying device of the present invention.

FIG. 4 shows the graph of the relationship between the pressure caused by the gas flow indicated by arrow C and the distance r from the center of the non-contact conveying device A at the parameter $h/D$.

Figure 5:
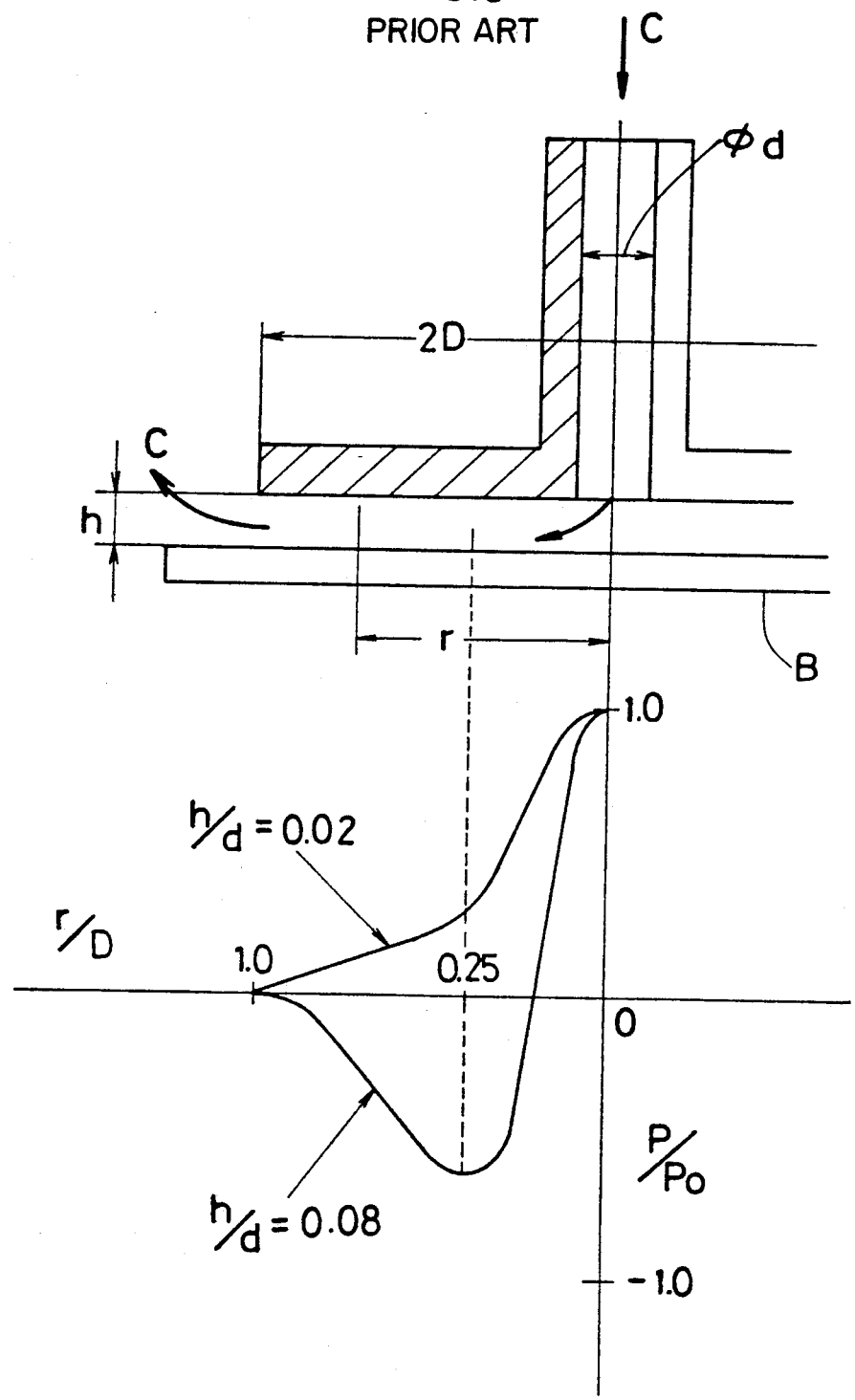
FIG. 5 shows a graph of a Bernoulli type pickup head of the prior art.

FIG. 5 shows a Bernoulli pickup head of the prior art at the parameter $h/d$.

Po. ... the pressure of the positive gas supply
P. ... the pressure caused on the surface of the article at the distance r from the center of the article
h. ... clearance formed between the operating surface 3 and the article B
D. ... the diameter of the cushion-vacuum room 2
d. ... the diameter of the ejector opening or the inlet nozzle of the prior art device And D is $4d$ in the example in FIGS. 4 and 5.

As described above, the pickup power of the present invention results from both ejector effect and Bernoulli effect and the parting power is caused by hovercraft effect and gas flow cushion effect. However, in the prior art device, the pickup power results only from the Bernoulli effect and the parting power is caused only by gas flow cushion effect.

Maximum pickup power or maximum parting power is exerted on the article B at the parameter $h/D$ in FIG. 4 and $h/D$ in FIG. 5, respectively. As shown in FIG. 4, the cushion-vacuum room 2 of the non-contact conveying device A acts as a vacuum room a of an ejector from $r/D=0.024$ to 0.5 and in the range from 0.24 to 0.05 and the operating surface 3 of the invention acts as a plate of a Bernoulli type pickup head. In the device shown in FIG. 4, the outer inclined portion outside of the Bernoulli surface 4 may act as a diffuser which makes the gas flow smooth. The maximum pickup power exerted on the article B of the non-contact conveying device A occurs at $h/D=0.02$ and the minimum Pressure value occurs at $P/Po=-1.51$ at $r/D=0.35$. That of the Bernoulli type pickup head of the prior art device occurs at $h/d=0.08$ and the minimum pressure value occurs at $P/Po=-0.06$ at $r/D=0.25$. Thus, the maximum pickup power of the non-contact conveying device A is 2.5 times larger than that of the Bernoulli type pickup head of the prior art.

The maximum parting Power exerted by the operating surface 3 or the boundary surface occurs at the parameter $h/D=0.005$ as shown in FIG. 4 and that of the Bernoulli type pickup head of the prior art occurs at the parameter $h/d=0.02$ as shown in FIG. 5. Thus, the non-contact conveying device A has a parting power 1.3 times larger than that of the Bernoulli type pickup head of the prior art.

As mentioned above, the non-contact conveying device A is superior to the prior Bernoulli type pickup head of the prior art in performance.

Other embodiments of the present invention are shown in FIGS. 6, 7, 8, and 9. Articles such as semiconductor wafers may tilt when lifted with respect to the operating surface 3 at the beginning of the lifting operation and may touch the operating surface 3. Articles become contaminated and/or damaged if they contact the operating surface 3 due to tilting. To overcome this problem, in another embodiment of the device A for the present invention, the cushion-vacuum room 2 is divided into a plurality of cushion-vacuum room portion 2a, 2b, 2c ... by walls 9. The walls 9 are disposed radially from the center of the cushion-vacuum room 2. Therefore, the cushion-vacuum room portions 2a, 2b, 2c, ... are independent respectively and the pressure in each cushion-vacuum room portion 2a, 2b, 2c based on clearance existing between each portion 2a, 2b, 2c,... and the article B is also independent of each other. For example, when the clearance between cushion-vacuum room portion 2a and article B may momentarily become small during transient movement and the article during the lifting operation, it results in the pressure within cushion-vacuum room portion 2a being increased. As the article B moves closer to the cushion-vacuum room portion 2a, the increased positive pressure increases the parting power preventing undesirable contact of the article with a portion of operating surface adjacent the cushion-vacuum room portion 2a. The increased pressure in the room portion 2a forces away the article B to a distance where the action forces exerted are at an equilibrium with to the suction forces. That is, the balance will be kept at the Position as if there is a cushion effect. Thus, the article B does not touch the operating surface 2/3 and is lifted up at large clearances thereby reaching an equilibrium position.

Figure 6:
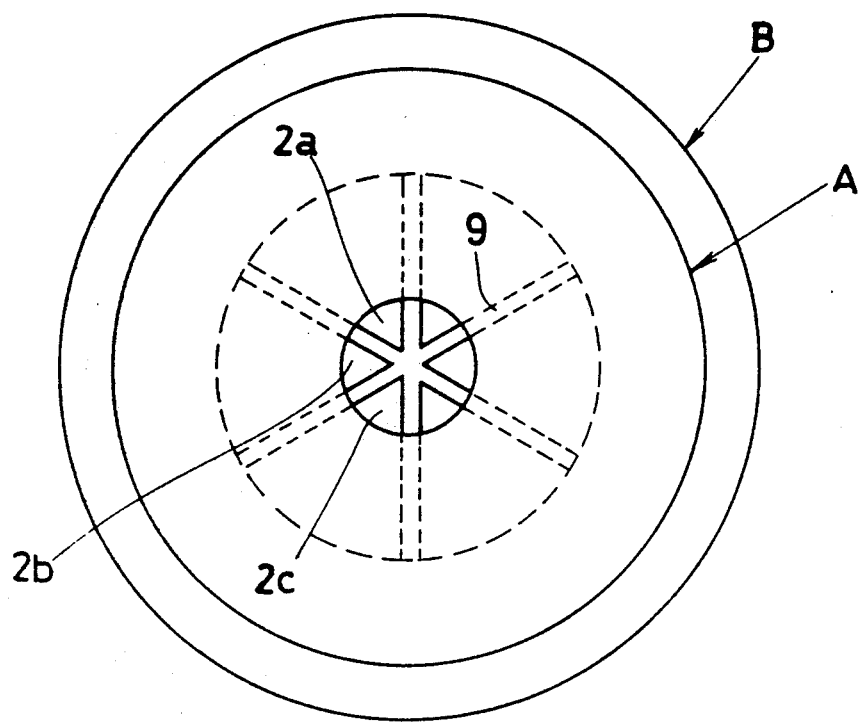
FIG. 6 shows a top Plan view of another embodiment of the present invention.
Figure 7:
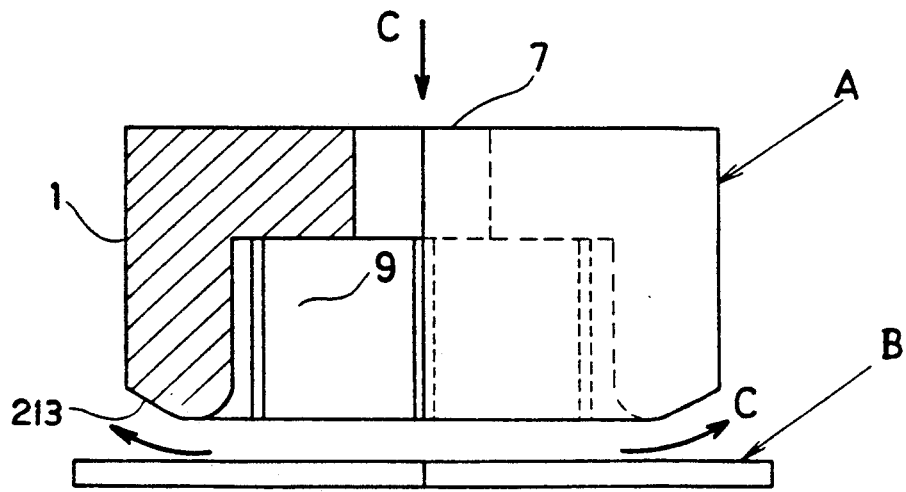
FIG. 7 shows a partial sectional side view of the embodiment of the Present invention shown in FIG. 6.
Figure 8:
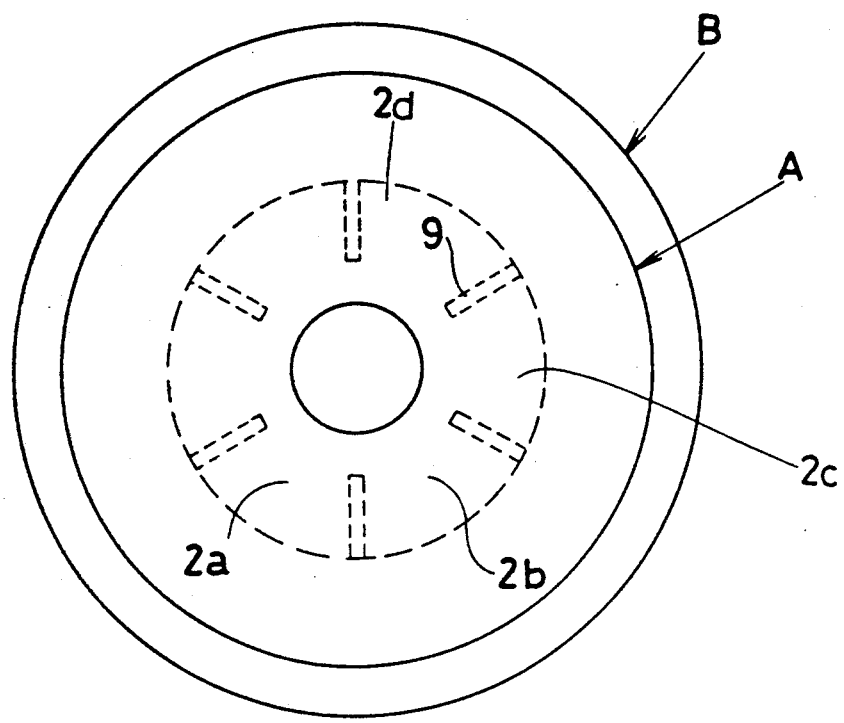
FIGS. 8 and 9 show a further embodiment of the present invention, in a top plan view and a partial sectional side view, respectively.
Figure 9:
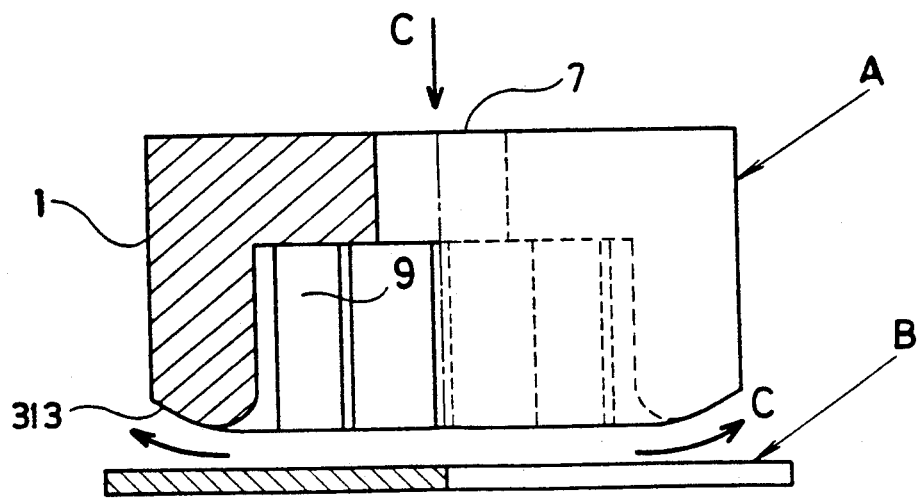

In these embodiments, an inner portion of the walls may extend to the center as shown in FIGS. 6 and 7, or may terminate in the cushion-vacuum room 2 as shown in FIGS. 8 and 9.

Figure 10:
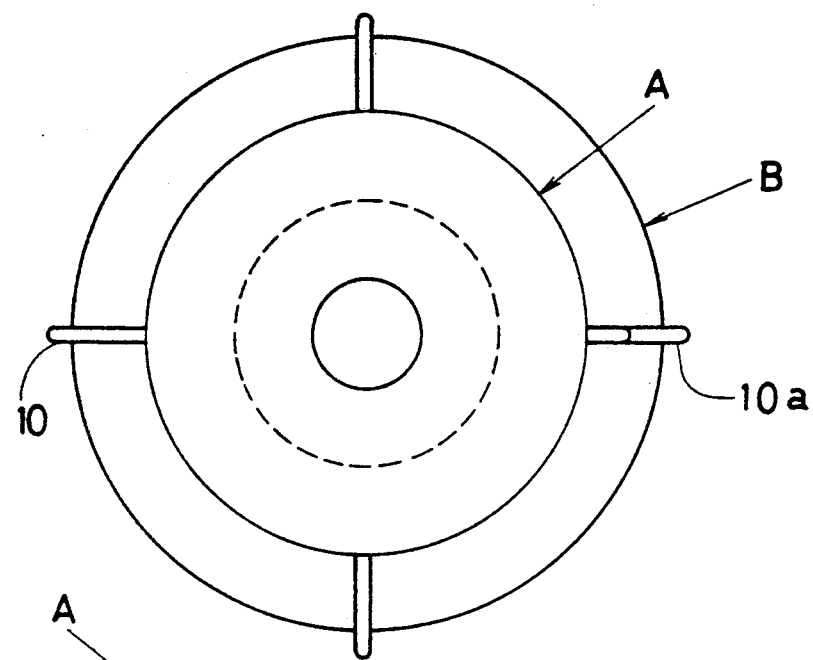
FIGS. 10 and 11 show still another embodiment of the present invention, in a top plan view and a side view, respectively.
Figure 11:
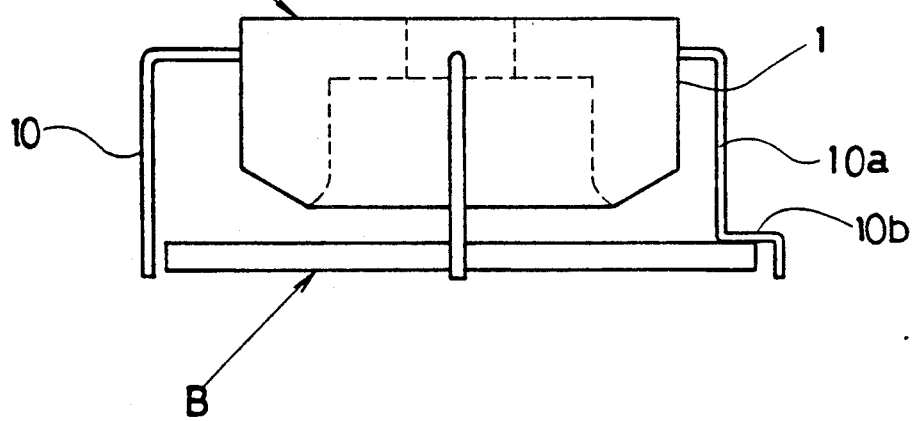
Figure 25:
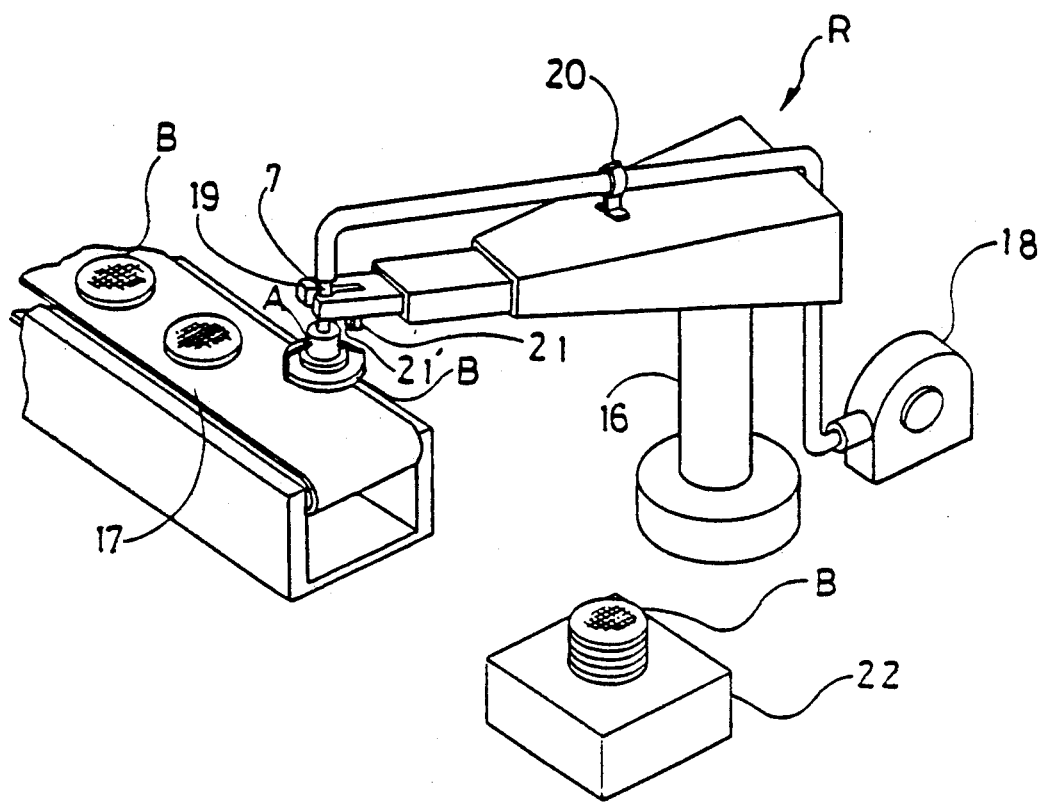
FIG. 25 is a perspective view of still another embodiment of the present invention.

FIGS. 10 and 11 show still another embodiment of the present invention which is provided with guide means 10 to prevent lateral movement of the article B being picked up. The guide means 10 allows a transfer of the article B from a first position to a second position by moving means, by such a robot R as shown in FIG. 25.

The guide means 10 comprises a plurality of bars extending radially and having stoppers extending below the plane in which the Bernoulli surface 4 exists. Also, some bars 10a may have steps 10b to contacts certain parts of the surface of the article B where contact is acceptable. The article B is prevented from lateral movement and can be placed at a desired position.

Figure 12:
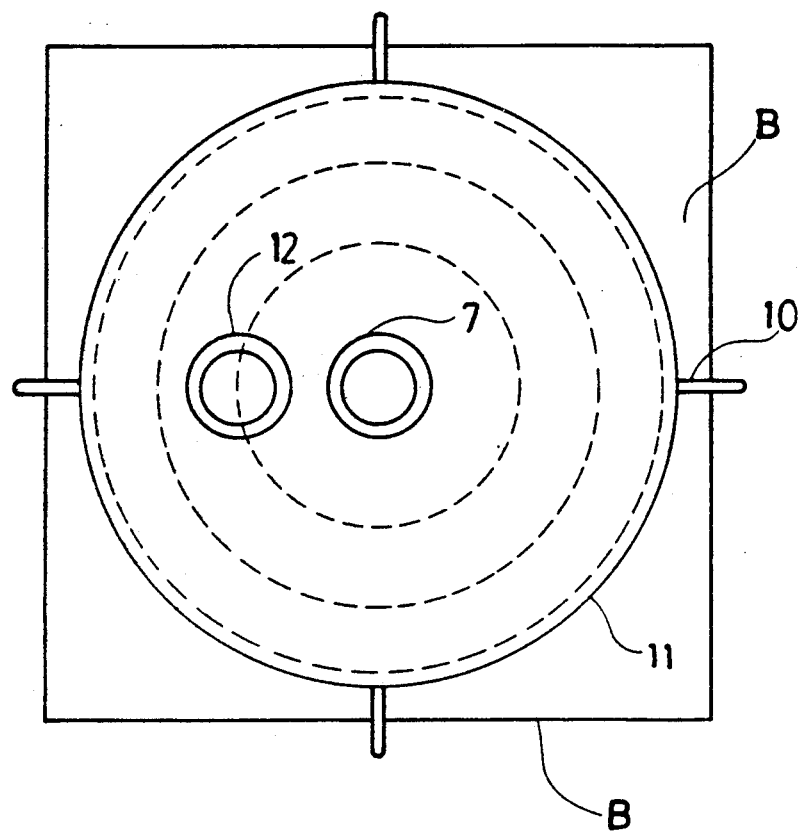
FIGS. 12 and 13 show a still further embodiment of the present invention, in a top plan view and a sectional side view, respectively.
Figure 13:
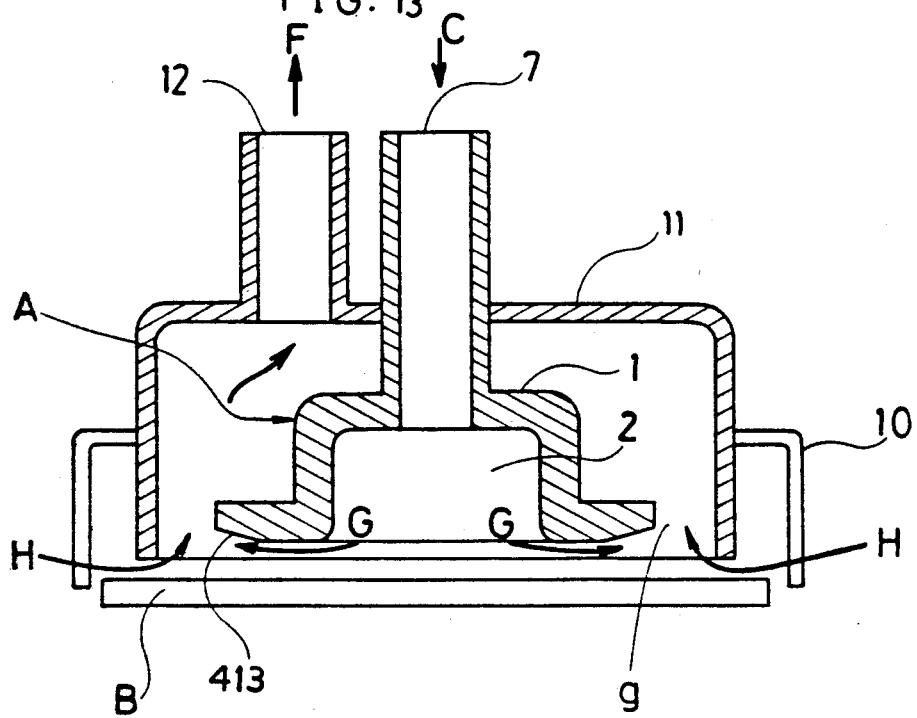

FIGS. 12 and 13 show a further embodiment of the present invention which is used in a high class clean room. The aforementioned non-contact conveying devices A are difficult to utilize in a high class clean room, since the air exhausted from the non-contact conveying device A may contaminate and/or disturb air flow in the clean room. In the embodiment shown in FIGS. 12 and 13, gas flow indicated by arrow C is jetted into the cushion-vacuum room 2 from the ejector opening 7 and thereafter passes through a space formed between the operating surface 413 and the article B, and is exhausted outside as an exhaust gas flow indicated by arrow G. If the exhaust gas flow indicated by arrow G discharges into the clean room, it contaminates and/or disturbs the air flow of the clean room.

Preventing the aforementioned problems, the device of the embodiment is provided with a hood 11 enclosing the outer periphery of the pickup head with a gap g. The gap g is communicating with a gas suction apparatus (not shown) through the Pipe 12 and the hood 11. The exhaust gas flow indicated by arrow G is suctioned as shown by arrow F through the gap into the gas suction apparatus, and it prevents the exhaust gas from being discharged into the clean room. A gas flow indicated by arrow F is continuous with the gas flow indicated by arrow G and gas flow indicated by arrow H suctioned from the clean room. The quantity of the gas flow indicated by arrow H is to be approximately 20% of that of the exhaust gas flow indicated by arrow G. Thus, the exhaust gas flow indicated by arrow G is never discharged into the clean room, contaminating and/or disturbing the air flow of the clean room.

Figure 14:
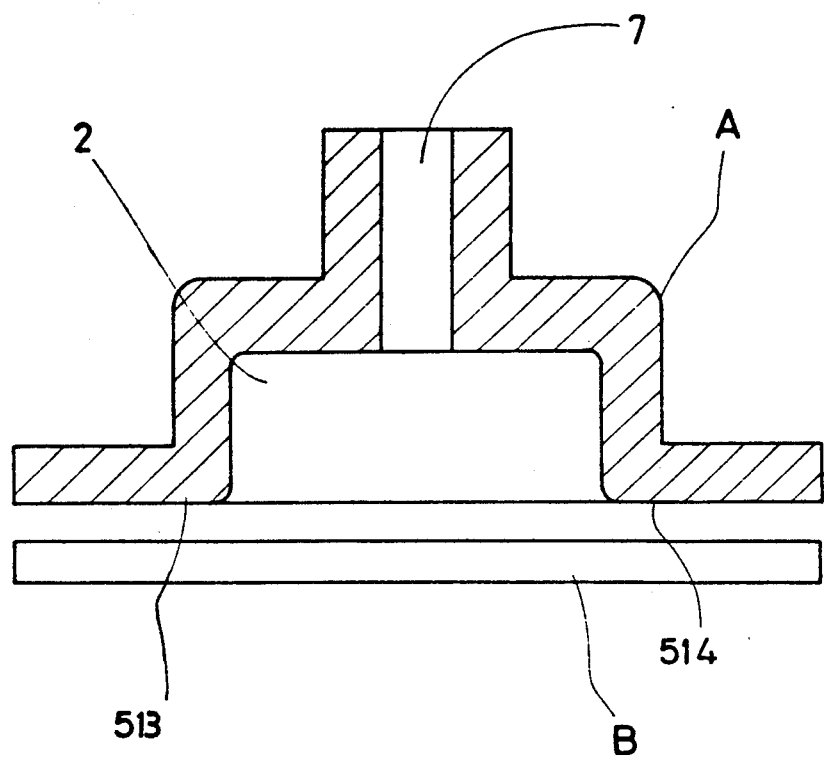
FIG. 14 shows a further embodiment of the present invention, in a side view.

FIG. 14 shows another embodiment of the present invention which has a flat shaped operating surface 513 at a bottom of said pickup head 1. The flat shaped operating surface 513 increases gas flow cushion effect caused at the space between the operating surface 513 and an article B. As said before, the Bernoulli surface 514 is defined as the innermost portion of the flat operating surface 513.

Figure 15:
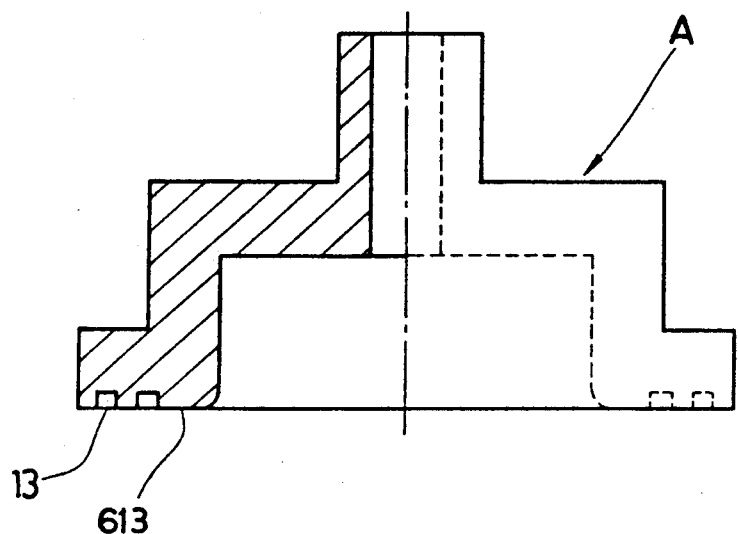
FIG. 15 shows still a further embodiment of the present invention, in a partial sectional side view
Figure 16:
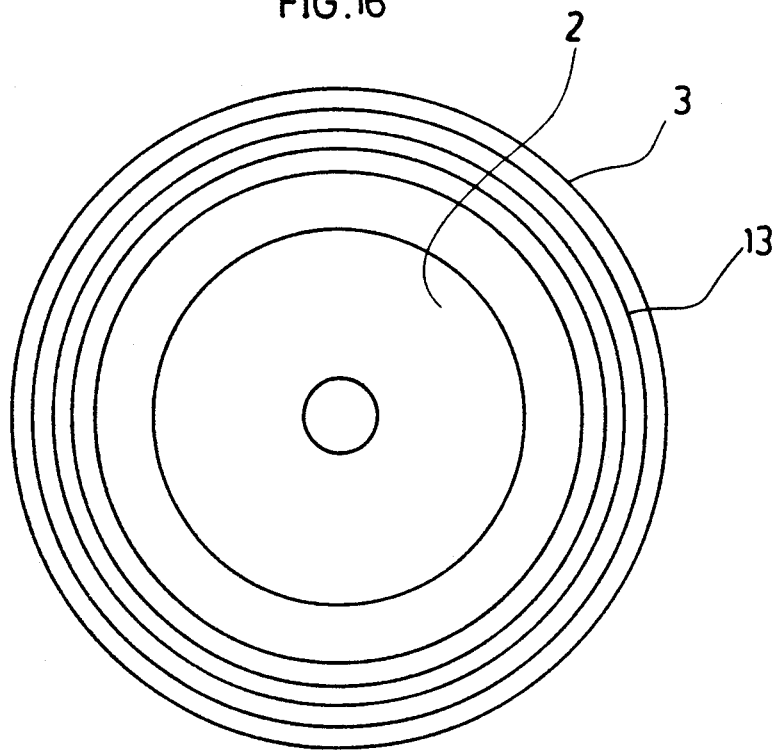
FIG. 16 shows a bottom Plan view of the embodiment of the present invention shown in FIG. 15.
Figure 23:
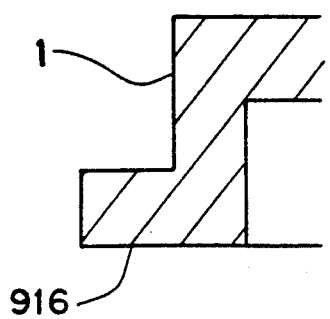
Figure 24:
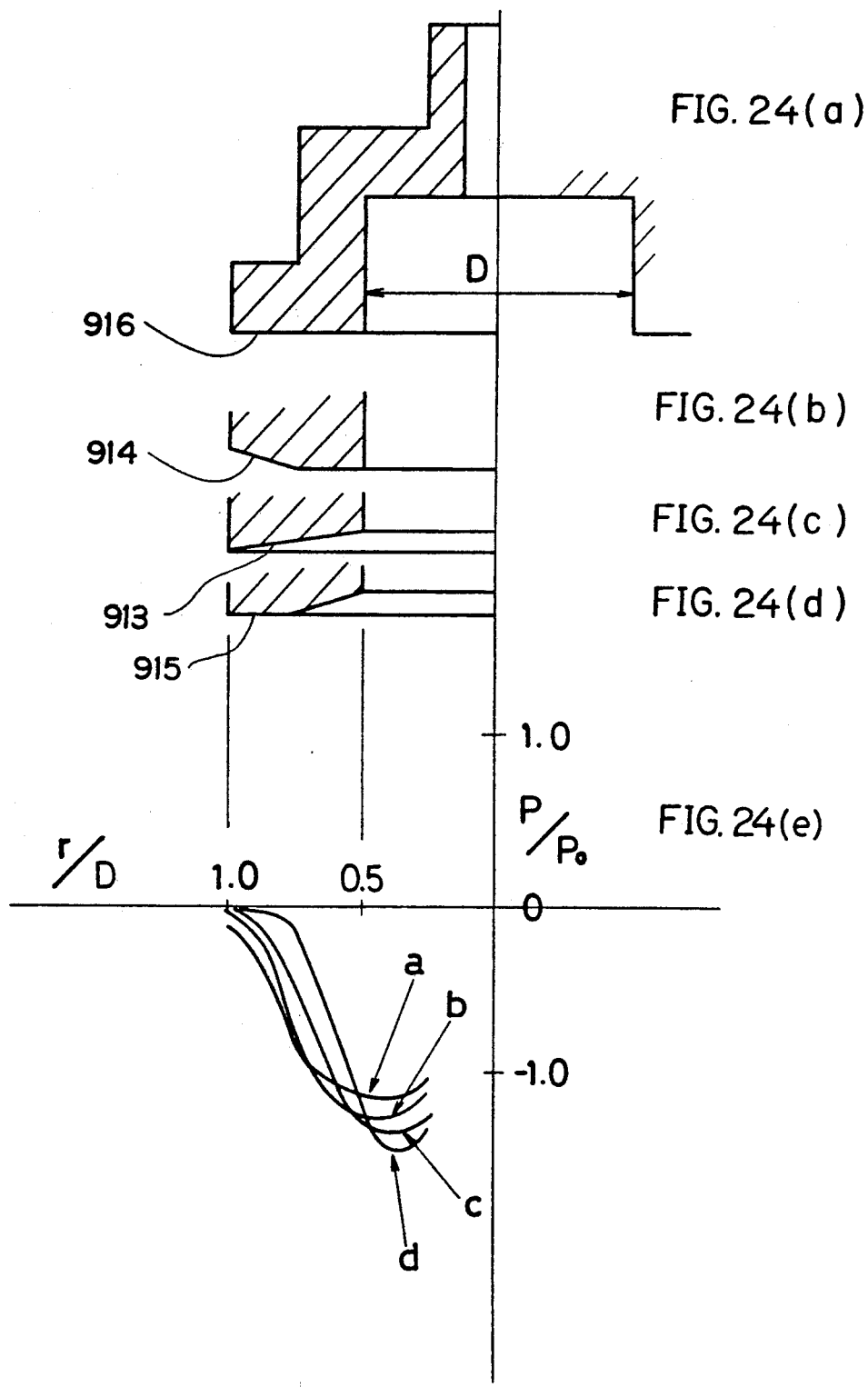
FIGS. 24(a) through 24(d) show various examples of operating surfaces on a pickup head corresponding to FIGS. 24–23 and FIG. 24(e) shows a graph of the relationship of the pressure to the distance from the center of the non-contact conveying device of another embodiment of the present invention.

FIGS. 15 and 16 show another embodiment of the invention being formed with a groove 13 at the operating surface 613 running along the inner surface of the cushion-vacuum room 2. The groove 13 may be continuous as shown in FIG. 16 or may be intermittent as shown in FIG. 19. Also the figure of the section of the groove 13 may be rectangular as shown in FIG. 15, or may be triangular as shown in FIG. 17. Additionally, a Plurality of the grooves 13 may be available as shown in FIGS. 15, 16, 17, and 19. FIG. 18 shows an example wherein the groove 13 is formed by setting a plurality of small round groove portions 13a. FIGS. 20, 21, 22, and 23 show another example of the operating surface 213. In the case of FIG. 20, the operating surface 913 has a conical portion 913a throughout the full width in the section including the center axis of the pickup head 1. The operating surface 914 of the pickup head of FIG. 21 has a conical portion 914a at the outer region and flat portion 914b at the inner region. The operating surface 915 of FIG. 22 has a flat portion 915b at the outer region and a conical portion 915a at the inner region. Also, the operating surface 916 of FIG. 23 is flat throughout the full width. FIG. 23 corresponds to FIG. 24(a), FIG. 21 corresponds to FIG. 24(b), FIG. 20 corresponds to FIG. 24(c), and FIG. 22 corresponds to FIG. 24(d).

Like these, the operating surface 3 may be in various forms including circular, noncircular, conical and flat.

FIG. 24(e) shows the negative pressure distributions in case of the pickup head shown in FIGS. 20, 21, 22, and 23. In FIG. 24(e), h/D is defined concerning FIG. 4 is 0.02.

FIG. 25 shows a non-contact conveying system of the invention, using a non-contact conveying device A of the invention, which can convey a work B to a predetermined place without contacting the work.

This non-contact conveying system, for example, consists of a conveying equipment 17, movement means R having a working arm 19 equipped with a non-contact conveying device A and sensors 21 and 21' which sense a work B and open or shut a solenoid valve 20 between an ejector opening 7 and a blower 18. The arm 19 can rotate and go up and down.

The movement means, a robot R in this case, may have electrical motors, air, oil cylinders, etc. The conveying equipment 17 may be conveyors, elevators, etc. Another machine, such as inspecting machines, are also available.

When the work B is conveyed at the end of the conveying equipment 17, the working arm 19 having the non-contact conveying device A comes down above the work B. When the sensor 21 senses the decided distance between the work B and the non-contact conveying device A, the solenoid valve 20 is opened, air from the blower 18 is sent from the ejector opening 7 into the non-contact conveying device A and the work B is hung up by the non-contact conveying device A.

When the sensor 21' senses the work B hung by the non-contact conveying device A, the movement means 16 rises up and turns. Coming above the stock table 22, the movement means stops, and then the solenoid valve 20 is closed. The work B is released from the non-contact conveying device A and placed on the stock table 22.

The movement means 16 after having parted the work B returns to the conveying equipment 17 again.

As mentioned, the work B conveyed by the conveying equipment 17 can be placed at the stock table 22.

According to the present invention, precise particles can be conveyed without contact.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A pick-up head for a non-contact conveying device, said pick-up head comprising:
   an upper wall;
   a side wall surrounding said upper wall;
   an operating surface formed at a lower annular edge of said side wall, said operating surface being positionable adjacent an article to be lifted;
   mans for providing a reduced pressure in an area formed within said upper wall and said side wall; and
   means for introducing a positive pressure gas supply into said pick-up head, said means for introducing including an opening disposed approximately at the center of said upper wall and said means for providing a reduced pressure including a cushion-vacuum room fully opened at the bottom of said pick-up head and of a sufficient depth to achieve a reduced pressure therein when said pick-up head is positioned adjacent an article to be lifted and said opening being positioned transverse with respect to a plane in which said annular edge exists for introducing a positive pressure gas supply into said cushion-vacuum room and over said operating surface, the diameter of said opening being smaller than that of said cushion-vacuum room, such that positioning of said pick-up head adjacent an article to be lifted produces a combined effect including an increased rate of gas flow over said operating surface and a reduced pressure within said cushion-vacuum room, thereby enabling non-contact pick-up of an article whose diameter is greater than that of said operating surface.

2. The pick-up head according to claim 1, wherein said pickup head is provided with guide means for restricting lateral movement of the article to be lifted, said guide means extending below a plane in which the operating surface exists.

3. The pick-up head according to claim 1, wherein said pickup head is provided with a hood which encloses the outer periphery of said pickup head with a gap therebetween, said gap communicating with a suction pipe of said hood.

4. The pick-up head according to claim 1, wherein said operating surface is round shaped in cross section including a center axis of said pickup head.

5. The pick-up head according to claim 1, wherein said operating surface is curved shaped in cross section including a center axis of said pickup head.

6. The pick-up head according to claim 1, wherein said operating surface has a conical portion.

7. The pick-up head according to claim 1, wherein said operating surface has a flat portion.

8. The pick-up head according to claim 1, wherein said operating surface has a circular portion.

* * * * *